United States Patent [19]

Ogino

[11] Patent Number: 5,110,764
[45] Date of Patent: May 5, 1992

[54] METHOD OF MAKING A BEVELED SEMICONDUCTOR SILICON WAFER

[75] Inventor: Nobuyoshi Ogino, Musashino, Japan

[73] Assignee: Shin-Etsu Handotai Co., Ltd., Tokyo, Japan

[21] Appl. No.: 641,780

[22] Filed: Jan. 16, 1991

Related U.S. Application Data

[62] Division of Ser. No. 505,475, Apr. 6, 1990, Pat. No. 5,021,862.

[30] Foreign Application Priority Data

Apr. 17, 1989 [JP] Japan .................................. 1-97749

[51] Int. Cl.$^5$ ........................................ H01L 21/463
[52] U.S. Cl. .................................. 437/224; 437/249; 437/947
[58] Field of Search ............... 437/225, 249, 947; 148/33.2, DIG. 161; 156/645

[56] References Cited

U.S. PATENT DOCUMENTS 4,630,093 12/1986 Yamaguchi et al. ...... 148/DIG. 161
4,783,225 11/1988 Maejima et al. ................ 437/249

FOREIGN PATENT DOCUMENTS 0024571 2/1979 Japan .
0113332 9/1980 Japan .................................. 156/645
60-224268 11/1985 Japan .................................. 357/55

OTHER PUBLICATIONS

Mendel, E. & Sullivan, P., "Reduction of Grinding and Lapping Defects", IBM Tech. Disc. Bull., vol. 25, No. 9, p. 4761, Feb. 1983.
Brieger, K. P. et al., "The Influence . . . Bevel Angle . . . Device", IEEE Trans. on Electron Devices, vol. ED-31, No. 6, pp. 733–738, Jun. 1984.

Primary Examiner—Brian E. Hearn
Assistant Examiner—C. Chaudhari
Attorney, Agent, or Firm—Oliff & Berridge

[57] ABSTRACT

A semiconductor silicon wafer usable for integrated circuits has beveled portions unsymmetrically formed along circumferential edges of front and back surfaces thereof. An angle between an inclining surface of the beveled portion and a main surface on the back surface side is larger than that between the inclining surface of the beveled portion and the main surface on the front surface side. Therefore the circumferential edges are prevented from being chipped.

3 Claims, 2 Drawing Sheets

*PRIOR ART*

METHOD OF MAKING A BEVELED SEMICONDUCTOR SILICON WAFER

This is a division of application Ser. No. 07/505,475, now U.S. Pat. No. 5,021,862, filed Apr. 6, 1990.

BACKGROUND OF THE INVENTION

1. Field of the Invention

The present invention relates to a semiconductor silicon wafer used to manufacture a semiconductor integrated circuit (IC) (i.e. semiconductor silicon wafer for IC).

2. Description of the Related Art

FIG. 3 shows a semiconductor silicon wafer for IC having symmetrical beveled portions 21a and 21b formed on the front and back surfaces thereof.

The beveled portions 21a and 21b of the semiconductor silicon wafer 21 are arranged as follows. Assuming that the beveled portion 21a on the front surface has a beveled width $w_1$ and a beveled depth $d_1$, and the beveled portion 21b on the back surface thereof has a beveled width $w_2$ and a beveled depth $d_2$, $w_1 = w_2$, and $d_1 = d_2$, and the angle $\theta_1$ between the inclining surface of the beveled portion 21a and the main surface on the front surface side [$\theta_1 = \arctan(d_1/w_1)$] is equal to the angle $\theta_2$ between the inclining surface of the beveled portion 21b and the main surface on the back surface side [$\theta_2 = \arctan(d_2/w_2)$]. Note that, in this case, the beveled width $w_1$ of the beveled portion 21a of the front surface and the beveled angle $\theta_1$ of the front surface are set to such values that do not cause a crown along the wafer edge when photoresist is applied or an epitaxial layer is formed later on the front surface.

Nevertheless, the following problems arise in the above technology.

As described above, according to the above semiconductor silicon wafer 21, the beveled width $w_1$ of the front beveled portion 21a is set to a width equal to or larger than a prescribed value and the front beveled angle $\theta_1$ is set so that a crown is not formed in the application of photoresist or the subsequent formation of an epitaxial layer. Along with the above consideration, the equations $w_1 = w_2$ and $d_1 = d_2$ are observed and the beveling therefore is symmetrically effected on the front and back surfaces, and thus the beveling of the back surface gives an adverse effect of chipping due to too much beveling aside from the above-mentioned effect of the beveling of the front surface.

More specifically, when $\theta_1$ has a small value, e.g., 20° or less, the width of the remained outer circumference of the wafer is narrowed, in other words, the outer circumferential edge of the wafer has a sharp wedge-shaped cross section. As a result, a problem arises in that the semiconductor silicon wafer is liable to be chipped off in the following processing.

SUMMARY OF THE INVENTION

Taking the above into consideration, it is an object of the present invention to provide a semiconductor silicon wafer and manufacturing method thereof capable of effectively preventing the silicon wafer from being chipped off.

Other objects and novel advantages of the present invention will be apparent from the following description and accompanying drawings.

To achieve the above object, according to one aspect of the present invention, there is provided a semiconductor silicon wafer adapted for integrated circuits, which has the beveled portions unsymmetrically formed with each other along the remained circumferential edges of the front and back surfaces thereof. An angle between the inclining surface of the beveled portion and the main surface on the back surface side is selected larger than that between the inclining surface of the beveled portion and the main surface on the front surface.

Further, according to another aspect of the present invention, the beveled depth of the back surface in the semiconductor silicon wafer mentioned above is selected larger than that of the front surface and the above respective angles are set such that the beveled portions formed on the front and back surfaces have the same beveled width.

Further, according to further aspect of the present invention, there is provided a manufacturing method of a semiconductor silicon wafer, in which the beveled portions of the front and back surfaces thereof are simultaneously formed by a grindstone having a grinding surface configuration which will conform with the inventive circumferential profile of the semiconductor silicon wafer after it is finished.

According to the present invention, since the angle between the inclining surface of the beveled portion and the main surface on the back surface side is selected larger than that on the front surface side to make the front and back beveled portions unsymmetrical, the front beveled portion and the back beveled portion are independently arranged so that the former can sufficiently prevent the occurrence of a crown and the latter can prevent the semiconductor silicon wafer from being chipped.

Further, according to the present invention, the beveled portions formed on the front and back surface sides have the same beveled width, and thus when the front and back beveled portions are simultaneously ground by the grindstone having the grinding surface which will conform with the circumferential edges of the semiconductor silicon wafer after it is finished, the peripheral corners of the front and back surfaces are simultaneously applied against the grinding surface of the grindstone, and the semiconductor silicon wafer is ground and finished at both the peripheral edges. As a result, applied force on one of the surfaces being ground is always supported by that on the other surface being ground, whereby the occurrence of undesirable strain due to grinding and chipping of the semiconductor silicon wafer can be prevented.

DESCRIPTION OF THE PREFERRED EMBODIMENTS

An embodiment of a semiconductor silicon wafer according to the present invention will be described below with reference to the drawings.

Figure 1:
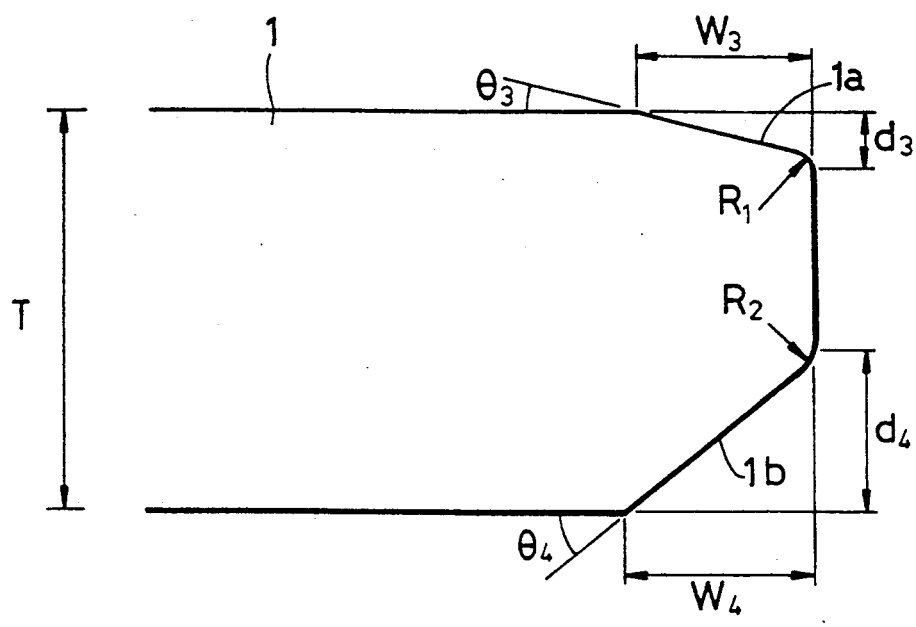
FIG. 1 is a diagram showing the circumferential edges and the vicinity thereof of an embodiment of a semiconductor silicon wafer according to the present invention.

FIG. 1 shows a semiconductor silicon wafer of the invention.

In the figure, numeral 1 designates the semiconductor silicon wafer, and beveled portions 1a and 1b are formed around the circumferential edges of the silicon wafer 1, so that the sectional figure of the wafer 1 on a vertical plane including the center of the wafer 1 gives generally a trapezoid at the beveled periphery which consists of both beveled surfaces and the vertical edge therebetween. The semiconductor silicon wafer 1 can be, for example, a semiconductor silicon wafer for IC having the beveled portions 1a and 1b formed unsymmetrically and used for forming a semiconductor integrated circuit.

More specifically, the semiconductor silicon wafer 1 of the embodiment is such that the beveled width $w_3$ of the beveled portion 1a on the front surface side is selected equal to the beveled width $w_4$ of the beveled portion 1b on the back surface side, and the beveled angle $\theta_4$ of the back surface [$\theta_4 = \arctan(d_4/w_4)$] is larger than the beveled angle $\theta_3$ of the front surface [$\theta_3 = \arctan(d_3/w_3)$]. That is, the beveled depth $d_4$ of the back surface is larger than the beveled depth $d_3$ of the front surface.

Further, the outermost circumferential edges of the wafer at the beveled portions 1a and 1b are rounded, the radii of curvature being shown as $R_1$ and $R_2$, respectively. These $R_1$ and $R_2$ may be shaped simultaneously when the beveled portions are machined, or may be formed by etching after the beveled portions have been machined.

The front beveled width $w_3$ and the beveled angle $\theta_3[=\arctan(d_3/w_3)]$ are set to be such values that do not cause a crown in the application of photoresist and the following formation of an epitaxial layer. In addition, the back beveled depth $d_4$ is set to be the value which can prevent the semiconductor silicon wafer from being chipped or to be a value larger than that of the front one. The values of $w_3$, $d_3$, $w_4$ and $d_4$ are, for example, set such that when the thickness T of the semiconductor silicon wafer 1 is 0.6 mm, $w_3$ is 300 μm, $d_3$ is 60 μm, $d_4$ is 300 μm, $d_4$ is 310 μm, $R_1$ is 200 μm, and $R_2$ is 400 μm.

Next, a method of manufacturing the above semiconductor silicon wafer 1 will be described.

First, an ingot of a silicon monocrystal is cut into round slices to provide a semiconductor silicon wafer 11 having a prescribed depth (numeral 11 is used to discriminate this wafer before the beveling from the semiconductor silicon wafer 1 to in which the beveled portions 1a and 1b have already been formed). Next, the beveled portions 1a and 1b are formed using a grindstone 2 shown in FIG. 2.

Figure 2:
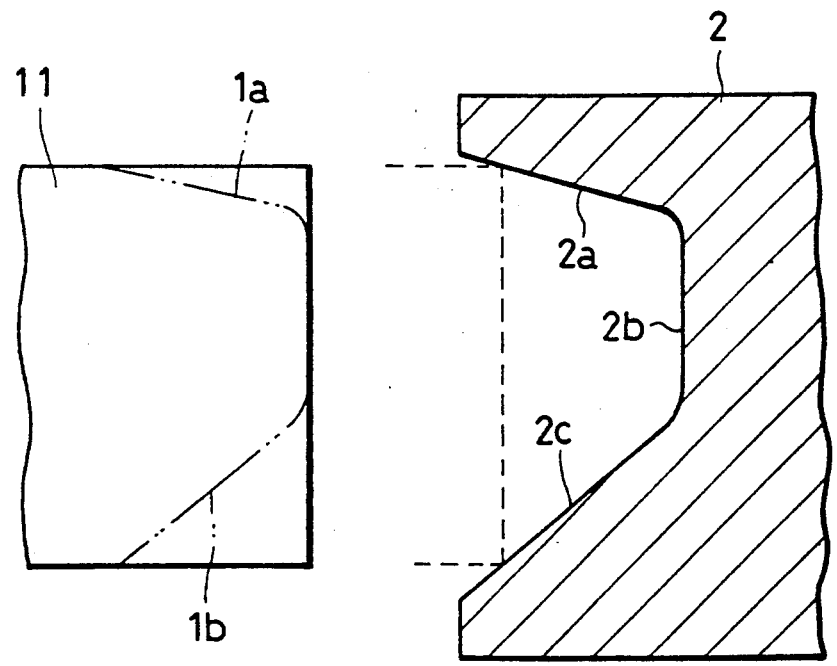
FIG. 2 is a diagram showing a semiconductor silicon wafer and the vicinity of the grinding surface of a grindstone used to grind the semiconductor silicon wafer.
Figure 3:
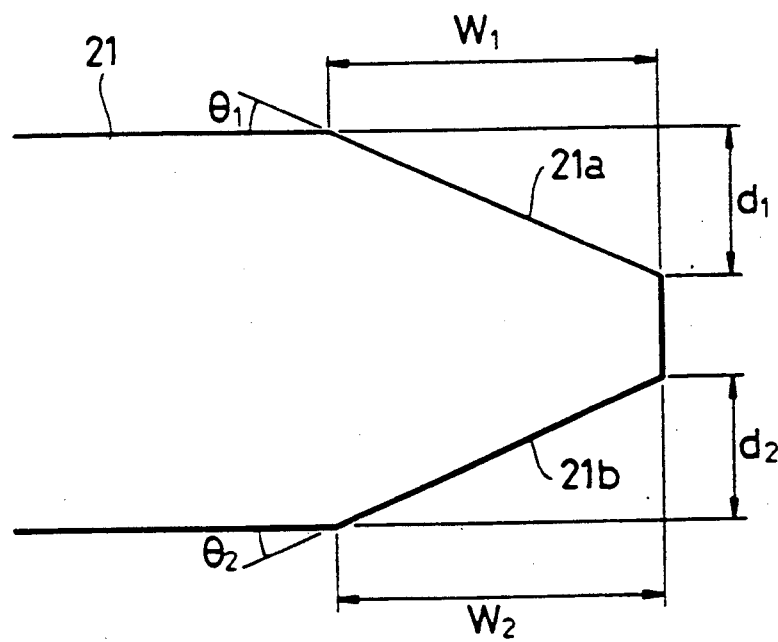
FIG. 3 is a diagram showing the circumferential portion and the vicinity thereof of an embodiment of a conventional semiconductor silicon wafer.

To describe here the grinding surfaces 2a, 2b, and 2c of the rotary grindstone 2 about an axis parallel with the perpendicular on to the main surface of a wafer to be beveled shown in FIG. 2, the configuration of the grinding surfaces 2a, 2b, and 2c of the grindstone 2 is in conformity with the predetermined configuration of the circumferential edges of the semiconductor silicon wafer 1 according to the invention. More specifically, the configurations of the grinding surfaces 2a, 2b, and 2c of the grindstone 2 are such that the circumferential edges of the semiconductor silicon wafer 1 according to the invention conform therewith.

When the above semiconductor silicon wafer 11 is ground using this grindstone 2, the wafer 11 is gradually moved in the direction approaching the rotation axis of the grindstone 2, while it is rotated in the direction opposite to that of the grindstone 2, whereby the beveled portions 1a and 1b are formed along the circumferential edges of the semiconductor silicon wafer 11.

The following effects can be obtained by the semiconductor silicon wafer 1 of the above embodiment and the manufacturing method thereof.

For the above semiconductor silicon wafer 1, since the angle $\theta_4$ between the inclining surface of the back beveled portion 1b and the main surface on the back surface side (the beveling angle of the back surface) is larger than the angle $\theta_3$ between the inclining surface of the beveled portion 1a and the main surface on the front surface side (the beveling angle of the front surface), and the beveled portions 1a and 1b of the front and back surfaces are made unsymmetrical, the front beveled portion 1a and the back beveled portion 1b can be differently shaped so that the former can sufficiently prevent the occurrence of a crown and the latter can prevent the semiconductor silicon wafer 1 from being chipped. More specifically, with respect to the above semiconductor silicon wafer 1, the effect of the back beveled portion thereof is more increased than that of a conventional wafer in preventing the wafer from being chipped in the following processing.

Further, the beveled portions 1a and 1b formed on the front and back surface sides have the same widths $w_3$ and $w_4$, and thus when the beveled portions 1a and 1b of the front and back surface sides are simultaneously formed using the grindstone having the grinding surfaces 2a, 2b, and 2c which will conform with the desired circumferential edges of the semiconductor silicon wafer 1 after it is finished, the corners of the front and back surfaces are simultaneously applied against the grinding surfaces 2a and 2c, whereby the grinding operation thereof is simultaneously started and finished. As a result, while the beveled portions 1a and 1b are ground, pressure on one of the surfaces being ground is always supported by that on the other surface being ground, whereby the occurrence of undesirable strain due to grinding and thus the chipping of the semiconductor silicon wafer can be prevented.

Further, according to the above manufacturing method, since the beveled portions 1a and 1b of the front and back surfaces are simultaneously formed by the grinder 2 having the grinding surfaces 2a, 2b, and 2c which will conform with the inventive circumferential edges of the semiconductor silicon wafer 1 after it is finished, the peripheral corners of the front and back surfaces can be simultaneously applied against the grinding surfaces 2a and 2c of the grindstone 2, and further the grinding operation of the semiconductor silicon wafer 1 is simultaneously started and finished. As a result, the occurrence of undesirable strain due to grinding and thus the chipping of the semiconductor silicon wafer can be prevented.

Although the present invention effected by the inventor has been described above in detail with reference to one embodiment, the invention is not limited to the above embodiment, but it is obvious that various modifications can be made within the scope of the invention and which do not depart from the spirit of the invention.

For example, although the beveled portions 1a and 1b are flatly depicted in the above example, one or both thereof may be formed to have curved surfaces. In this case, the beveled portions 1a and 1b formed on both main surface sides of the semiconductor silicon wafer 1 are formed as curves.

The effects provided by the typical inventions disclosed in this application will be simply described below.

According to the present invention, since the angle between the inclining surface of the beveled portion and the main surface on the back surface side is larger than that on the front surface side to make the front and back beveled portions unsymmetrical, the front beveled portion and the back beveled portion are differently shaped so that the former can sufficiently prevent the occurrence of a crown and the latter can prevent the semiconductor silicon wafer 1 from being chipped. Further, according to the present invention, the beveled portions formed on both the main surface sides have the same beveled width in the first invention, and thus when the front and back beveled portions are simultaneously ground by the grindstone having the grinding surface which conforms with the predetermined circumferential edges of the semiconductor silicon wafer after it is finished, the peripheral corners of the front and back surfaces are simultaneously applied against the grinding surface of the grindstone, and further the grinding operation of the semiconductor silicon wafer is simultaneously started and then finished, As a result, the occurrence of undesirable strain due to grinding and the chipping of the semiconductor silicon wafer can be prevented.

What is claimed is:

1. A method of manufacturing a semiconductor silicon wafer usable for integrated circuits, comprising the steps of:
   providing an unbeveled semiconductor silicon wafer; and
   grinding a circumference of said wafer by means of a grindstone having a grinding surface configuration which conforms with a predetermined unsymmetrical circumferential edge beveling configuration of a semiconductor silicon wafer product to simultaneously form unsymmetrical beveled portions on front and back sides of said wafer product, wherein said grinding step comprises grinding said front and back sides to an equal grinding width, thereby applying all grinding force simultaneously on both said front and back sides of said wafer product.

2. A method of manufacturing a semiconductor silicon wafer according to claim 1, wherein said grindstone is rotated and said wafer is moved toward a center of rotation of said grindstone while said wafer is rotated in a direction opposite to a direction of rotation of said grindstone.

3. A method of manufacturing a semiconductor silicon wafer usable for integrated circuits, comprising the steps of:
   providing a silicon wafer having an unbeveled edge; and
   grinding said unbeveled edge of said silicon wafer by means of a grindstone have a grinding surface configuration conforming with a predetermined edge beveling configuration of a silicon wafer product, wherein said predetermined edge beveling configuration defines a front side beveled edge and a back side beveled edge of said silicon wafer product simultaneously at the completion of said grinding step, and wherein said front side beveled edge and said back side beveled edge of said silicon wafer have equal widths, and a beveling depth of said back side of said silicon wafer is larger than a beveling depth of said front side of said silicon wafer.

* * * * *

UNITED STATES PATENT AND TRADEMARK OFFICE
CERTIFICATE OF CORRECTION

PATENT NO. : 5,110,764

DATED : May 5, 1992

INVENTOR(S) : Nobuyoshi OGINO

It is certified that error appears in the above-identified patent and that said Letters Patent is hereby corrected as shown below:

Column 3, line 56, delete "to";

line 62, delete "on".

Signed and Sealed this

Twentieth Day of July, 1993

Attest:

MICHAEL K. KIRK

Attesting Officer     Acting Commissioner of Patents and Trademarks